(12) United States Patent
Lee et al.

(10) Patent No.: US 10,497,825 B2
(45) Date of Patent: Dec. 3, 2019

(54) LIGHT EMITTING ELEMENT AND LIGHT EMITTING DEVICE INCLUDING THE SAME

(71) Applicant: LG Display Co., Ltd., Seoul (KR)

(72) Inventors: Sang-Uk Lee, Seoul (KR); Won-Yong Jang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/856,454

(22) Filed: Dec. 28, 2017

(65) Prior Publication Data

US 2018/0190861 A1 Jul. 5, 2018

(30) Foreign Application Priority Data

Dec. 30, 2016 (KR) .................. 10-2016-0183709

(51) Int. Cl.
| | |
|---|---|
| *H01L 33/62* | (2010.01) |
| *H01L 33/00* | (2010.01) |
| *H01L 27/15* | (2006.01) |
| *H05B 33/08* | (2006.01) |
| *H01L 33/38* | (2010.01) |
| *H01L 33/06* | (2010.01) |
| *H01L 33/28* | (2010.01) |
| *H01L 33/30* | (2010.01) |
| *H01L 33/32* | (2010.01) |

(52) U.S. Cl.
CPC ........ *H01L 33/0037* (2013.01); *H01L 27/156* (2013.01); *H01L 33/38* (2013.01); *H01L 33/62* (2013.01); *H05B 33/0824* (2013.01); *H05B 33/0827* (2013.01); *H01L 33/06* (2013.01); *H01L 33/28* (2013.01); *H01L 33/30* (2013.01); *H01L 33/32* (2013.01)

(58) Field of Classification Search
CPC ...... H01L 33/0037; H01L 33/38; H01L 33/62
See application file for complete search history.

(56) References Cited

U.S. PATENT DOCUMENTS

| | | | |
|---|---|---|---|
| 2012/0235144 A1 | 9/2012 | Choung | |
| 2015/0255950 A1* | 9/2015 | Tokuda | H01S 5/0425 |
| | | | 372/38.05 |
| 2016/0225863 A1* | 8/2016 | Simin | H01L 29/404 |
| 2017/0005296 A1* | 1/2017 | Soci | H01L 51/5296 |

FOREIGN PATENT DOCUMENTS

| | | |
|---|---|---|
| CN | 101409322 A | 4/2009 |
| CN | 101685845 A | 3/2010 |
| EP | 0047035 A2 | 3/1982 |

OTHER PUBLICATIONS

Chinese Office Action issued in co-pending Chinese Patent Application No. 201711205256.6, dated Aug. 21, 2019.

* cited by examiner

*Primary Examiner* — Douglas M Menz
(74) *Attorney, Agent, or Firm* — Polsinelli PC

(57) ABSTRACT

Disclosed are a light emitting element, which may reduce power consumption, and a light emitting device including the same. The light emitting element includes an active layer emitting light by recombination of electrons and holes respectively supplied from first and second electrodes, and a control electrode controlling light emission of the active layer. Therefore, a transistor conventionally connected to the light emitting element may be omitted and thus power loss generated due to the transistor may be prevented.

20 Claims, 5 Drawing Sheets

100

LIGHT EMITTING ELEMENT AND LIGHT EMITTING DEVICE INCLUDING THE SAME

CROSS-REFERENCE TO RELATED APPLICATION

This application claims the benefit of Korean Patent Application No. 10-2016-0183709, filed on Dec. 30, 2016, which is hereby incorporated by reference in its entirety as if fully set forth herein.

BACKGROUND

Field of the Disclosure

The present disclosure relates to a display device, and more particularly, to a light emitting element and a light emitting device including the same. Although the present disclosure has a wide scope of applications, it is particularly suitable for reducing power consumption of a light emitting element and a light emitting device including the same.

Description of the Background

Light emitting elements, such as light emitting diodes (hereinafter, referred to as "LEDs") and laser diodes using a group III-V or II-VI compound semiconductor, may produce light of various colors, such as red light, green light, blue light and ultraviolet light, due to thin film growth technology and development of element materials. Further, light emitting elements may produce white light having high efficiency by color combinations using a fluorescent material. In addition, the light emitting elements have advantages, such as low power consumption, semi-permanent lifespan, high response speed, safety and environmental friendliness, as compared to the conventional light sources, such as fluorescent lamps, incandescent lamps, etc.

Therefore, application of light emitting elements has been increased to a transmission module of optical communication means, a light emitting diode backlight used as a substitute for a cold cathode fluorescent lamp (CCFL) forming a backlight of a liquid crystal display (LCD), a white light emitting diode lighting apparatus used as a substitute for a fluorescent lamp or an incandescent lamp, a vehicle head light, a traffic light, etc.

An LED driving unit to drive an LED includes a transistor TR connected to the LED according to the related art shown in FIG. 1. The transistor TR is connected to a cathode of the LED and controls flow of current flowing in the LED through an on/off function.

As such, in order to drive the conventional LED, the transistor TR should be provided. However, the on/off operation of the transistor TR results in heavy power loss and the transistor TR increases an area of a circuit board on which the LED driving unit is disposed.

SUMMARY

Accordingly, the present disclosure is directed to a light emitting element and a light emitting device including the same that substantially obviate one or more problems due to limitations and disadvantages of the prior art.

The present disclosure is to provide a light emitting element, which may reduce power consumption, and a light emitting device including the same.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the disclosure, as embodied and broadly described herein, a light emitting element includes an active layer disposed on a substrate and emitting light, first and second semiconductor layers being opposite each other under the condition that the active layer is interposed therebetween, a first electrode contacting one of the first and second semiconductor layers, a second electrode contacting the other of the first and second semiconductor layers, and a control electrode configured to control light emission of the active layer.

In an another aspect of the present disclosure, a light emitting element on a substrate includes an active layer disposed on the substrate to emit light; first and second semiconductor layers facing each other with the active layer interposed therebetween; a first electrode contacting one of the first and second semiconductor layers; a second electrode contacting the other of the first and second semiconductor layers; and a control electrode configured to turn on and turn off an emission of the active layer by reversing a moving path of electrons and holes supplied to the active layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Reference will now be made in detail to the various aspects of the present disclosure, examples of which are illustrated in the accompanying drawings.

Figure 1:
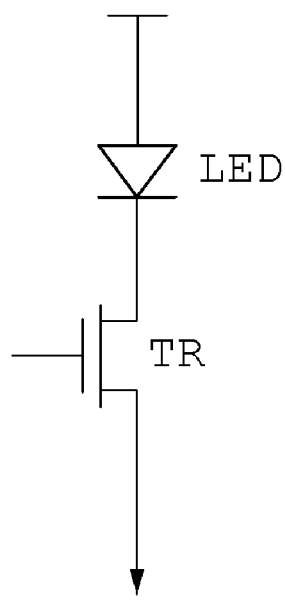
FIG. 1 is a view illustrating an LED and a transistor connected thereto according to the related art.
Figure 2:
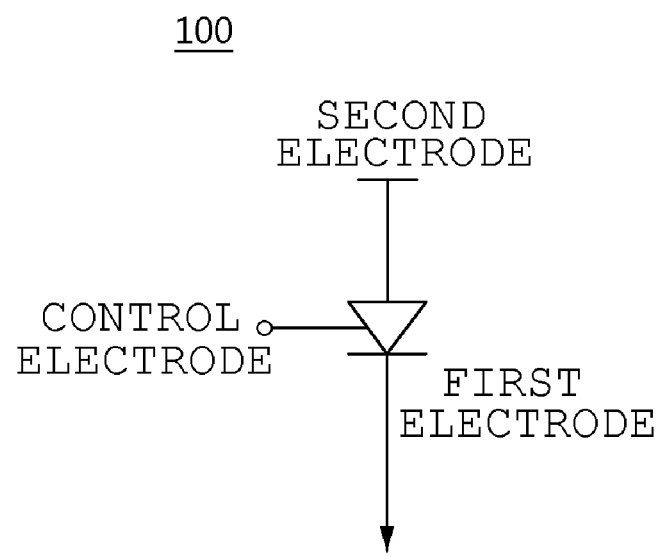
FIG. 2 is a circuit diagram illustrating an LED having a control electrode in accordance with the present disclosure.
Figure 3:
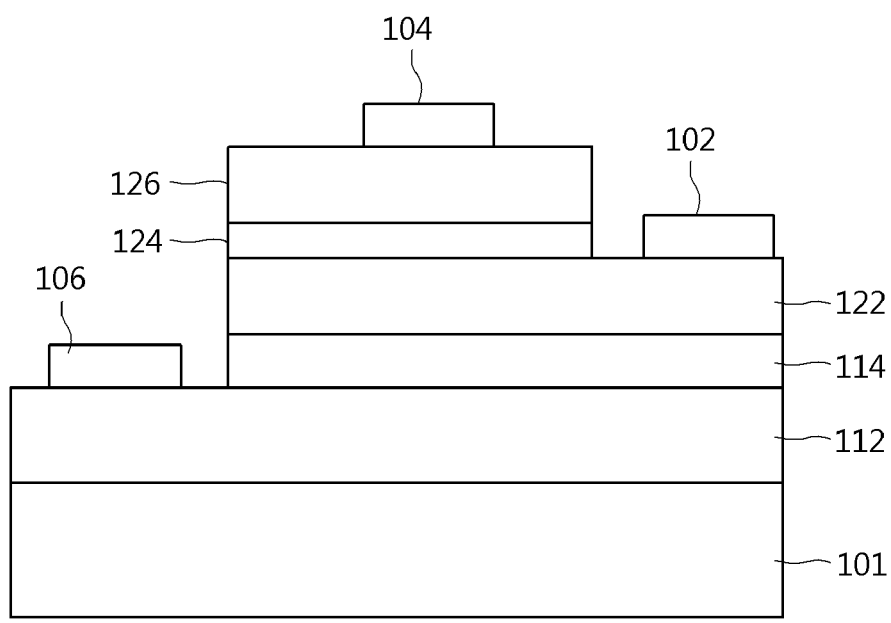
FIG. 3 is a cross-sectional view of the LED having the control electrode shown in FIG. 2.

FIG. 2 is a circuit diagram illustrating an LED having a control electrode in accordance with the present disclosure, and FIG. 3 is a cross-sectional view of the LED having the control electrode shown in FIG. 2.

An LED 100 shown in FIGS. 2 and 3 includes a substrate 101, a light emitting structure and a switching structure.

An insulating, conductive or semiconductor substrate may be used as the substrate 101. For example, the substrate 101 is formed of sapphire ($Al_2O_3$), SiC, Si, $MgAl_2O_4$, MgO, $LiAlO_2$, $LiGaO_2$, GaN or SiAl.

The light emitting structure includes a first semiconductor layer 122, an active layer 124, a second semiconductor layer 126 and first and second electrodes 102 and 104, which are stacked on the substrate 101.

The first semiconductor layer 122 is formed of a group III-V or a group II-VI compound semiconductor doped with an n-type dopant. Si, Ge, Sn, Se or Te may be used as the n-type dopant, but the disclosure is not limited thereto. For example, the first semiconductor layer 122 is formed of a semiconductor material having an empirical formula of $Al_xIn_yGa_{(1-x-y)}N$ ($0 \leq x \leq 1$, $0 \leq y \leq 1$, $0 \leq x+y \leq 1$). The first semiconductor layer 122 may include one of GaN, InN, AlN, InGaN, AlGaN, InAlGaN, AlInN, AlGaAs, InGaAs, AlInGaAs, GaP, AlGaP, InGaP, AlInGaP and InP. The first semiconductor layer 122 serves to provide electrons from the first electrode 102 to the active layer 124.

The second semiconductor layer 126 is formed of a group III-V or a group II-VI compound semiconductor doped with a p-type dopant. Mg, Zn, Ca, Sr or Ba may be used as the p-type dopant, but the disclosure is not limited thereto. For example, the second semiconductor layer 126 is formed of a semiconductor material having an empirical formula of $In_xAl_yGa_{1-x-y}N$ ($0 \leq x \leq 1$, $0 \leq y \leq 1$, $0 \leq x+y \leq 1$). The second semiconductor layer 126 serves to provide holes from the second electrode 104 to the active layer 124.

The active layer 124 may be disposed between the first semiconductor layer 122 and the second semiconductor layer 126. In the active layer 124, electrons injected through the first semiconductor layer 122 and holes injected through the second semiconductor layer 126 are recombined with each other, thus emitting light having an energy determined by an intrinsic energy band of a material forming the active layer 124. The active layer 124 is formed to have at least one structure of a double hetero structure, a multi-well structure, a single quantum well structure, a multi-quantum well (MQW) structure, a quantum wire structure and a quantum dot structure. Well/barrier layers of the active layer 124 may be formed to have one or more paired structures of InGaN/GaN, InGaN/InGaN, GaN/AlGaN, InAlGaN/GaN, GaAs (InGaAs)/AlGaAs, GaP(InGaP)/AlGaP, but the disclosure is not limited thereto. The well layer may be formed of a material having a lower band gap energy than the band gap energy of the barrier layer.

The first electrode 102 is formed on the first semiconductor layer 122 exposed by the active layer 124 and the second semiconductor layer 126. The second electrode 104 is formed on the second semiconductor layer 126.

In the present disclosure, a structure in which the first electrode 102 is used as a cathode and the second electrode 104 is used as an anode will be exemplarily described. Therefore, a first voltage is supplied to the first electrode 102 and a second voltage higher than the first voltage is supplied to the second electrode 104.

Further, the first electrode 102 is formed of a material having a higher work function than the second electrode 104 and, thus, electron injection into the active layer 124 through the first semiconductor layer 122 is facilitated. Conversely, the second electrode 104 is formed of a material having a lower work function than the first electrode 102 and, thus, hole injection into the active layer 124 through the second semiconductor layer 126 is facilitated.

The first and second electrodes may be formed of at least one of titanium (Ti), chrome (Cr), nickel (Ni), aluminum (Al), platinum (Pt), gold (Au), tungsten (W), molybdenum (Mo) and ITO, but the disclosure is not limited thereto.

The switching structure includes a third semiconductor layer 112, an interlayer insulating film 114 and a control electrode 106.

The third semiconductor layer 112 is formed on the substrate 101 so as to be disposed between the substrate 101 and the first semiconductor layer 122. The third semiconductor layer 112 is connected to the control electrode 106 and is formed of a group III-V or group II-VI compound semiconductor doped with a p-type dopant, in the same manner as the second semiconductor layer 126. The third semiconductor layer 112 may be formed of the same material as or a different material from the second semiconductor layer 126 formed of a semiconductor material doped with a p-type dopant.

The interlayer insulating film 114 is formed between the first and third semiconductor layers 122 and 112. The interlayer insulating film 114 prevents holes from the control electrode 106 from moving to the active layer 124 and prevents electrodes from the first electrode 102 from moving to the third semiconductor layer 112. Therefore, the interlayer insulating film 114 may prevent formation of a current path between the first and third semiconductor layers 122 and 112, thus preventing increase in power consumption. The first and third semiconductor layers 122 and 112 may directly contact each other without the interlayer insulating film 114 disposed between the first and third semiconductor layers 122 and 112. In this case, no separate light emitting layer is present between the first and third semiconductor layers 122 and 112 and, thus, even if a current path is formed between the first and third semiconductor layers 122 and 112, the LED 100 does not emit light.

The control electrode 106 is formed on the third semiconductor layer 112 exposed by the interlayer insulating film 114. Since a third voltage higher than the second voltage supplied to the second electrode 104 is supplied to the control electrode 106 and the control electrode 106 is formed of a material having a higher work function than the second electrode 104, electron injection into the third semiconductor layer 112 is facilitated. The control electrode 106 may be formed of at least one of titanium (Ti), chrome (Cr), nickel (Ni), aluminum (Al), platinum (Pt), gold (Au), tungsten (W), molybdenum (Mo) and ITO, but the disclosure is not limited thereto.

The above-described LED 100 shown in FIGS. 2 and 3 controls whether or not the LED 100 emits light using the switching structure including the control electrode 106 even without a separate transistor.

Figure 4A:
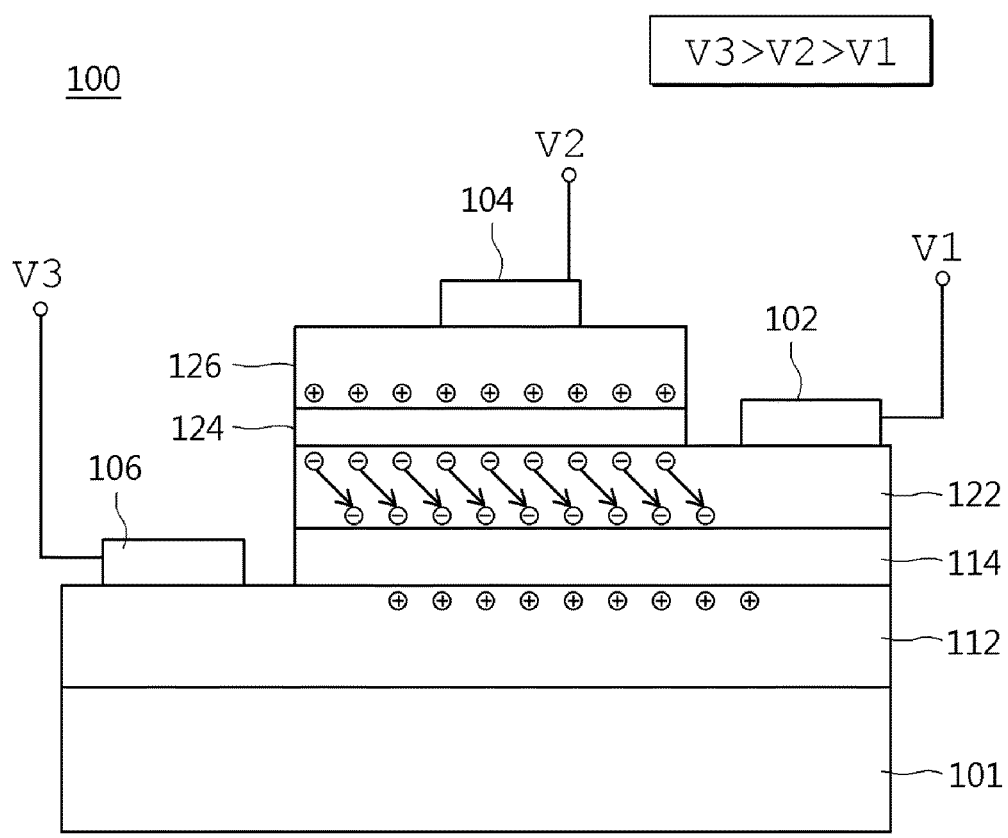
FIGS. 4A and 4B are cross-sectional views illustrating a driving method of the LED having the control electrode shown in FIG. 3.

That is, as exemplarily shown in FIG. 4A, a first voltage V1 is supplied to the first electrode 102 of the LED 100, a second voltage V2 higher than the first voltage V1 is supplied to the second electrode 104, and a third voltage V3 higher than the second voltage V2 is supplied to the control electrode 106. In this case, the energy level of the first electrode 102 is higher than the energy level of the second electrode 104, and the energy level of the second electrode 104 is higher than the energy level of the control electrode 106. Here, electrons move from a place having a high energy level to a place having a low energy level, and holes move from a place having a low energy level to a place having a high energy level. Therefore, holes discharged from the second electrode 104 move to the active layer 124, i.e., in a direction to the first electrode 102 having a higher energy level than that of the second electrode 104, and electrons discharged from the first electrode 102 move to the interlayer insulating film 114, i.e., in a direction to the control electrode 106 having a lower energy level than that of the first electrode 102. That is, electrons discharged from the first electrode 102 do not move to the active layer 124 and are collected in the interlayer insulating film 114. Therefore, driving current does not flow between the first and second electrodes 102 and 104 by the control electrode 106 of the switching structure and, thus, the active layer 124 of the light emitting structure does not emit light.

Figure 4B:
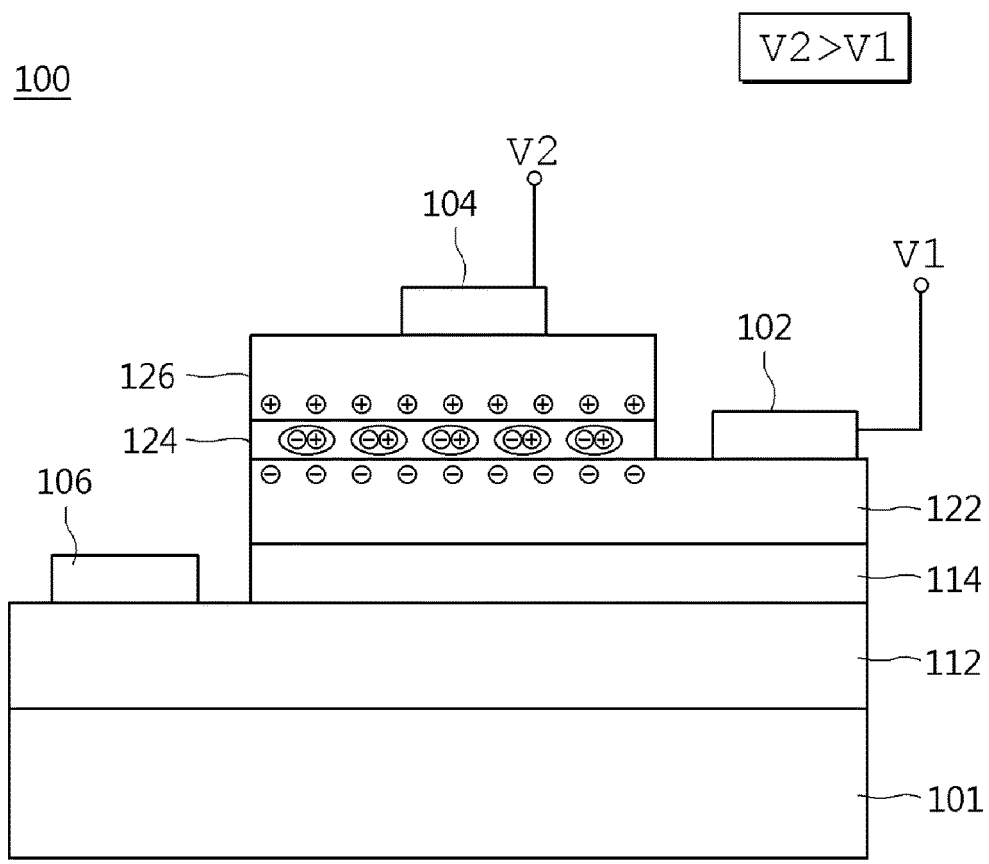

Further, as exemplarily shown in FIG. 4B, a first voltage V1 is supplied to the first electrode 102 of the LED 100, and a second voltage V2 higher than the first voltage V1 is supplied to the second electrode 104. Here, a third voltage V3 lower than the second voltage V2 supplied to the second electrode 104 may be supplied to the control electrode 106, or a third voltage V3 having the same level as the first voltage V1 supplied to the first electrode 102 may be supplied to the control electrode 106. In this case, the energy level of the first electrode 102 is higher than the energy level of the second electrode 104. Therefore, holes discharged from the second electrode 104 move to the active layer 124, i.e., in a direction to the first electrode 102 having a higher energy level than that of the second electrode 104, and electrons discharged from the first electrode 102 move to the active layer 124, i.e., in a direction to the second electrode 104 having a lower energy level than that of the first electrode 102. That is, electrons discharged from the first electrode 102 and holes discharged from the second electrode 104 are collected in the active layer 124. Therefore, driving current flows between the first and second electrodes 102 and 104 via the control electrode 106 of the switching structure and, thus, the LED 100 emits light.

As described above, in the present disclosure, when a first voltage V1 is supplied to the first electrode 102 and a second voltage V2 is supplied to the second electrode 104, the LED emits light. Otherwise, when, during light emission of the LED 100 or in order to emit light from the LED 100, the first voltage V1 is supplied to the first electrode 102, the second voltage V2 is supplied to the second electrode 104 and a third voltage V3 lower than the second voltage V2 or having the same level as the first voltage V1 is supplied to the control electrode 106, light emission of the active layer 124 is maintained. Thereafter, when, during light emission of the LED 100, a third voltage V3 higher than the second voltage V2 supplied to the second electrode 104 is supplied to the control electrode 106, the LED 100 stops emitting light.

Figure 5A:
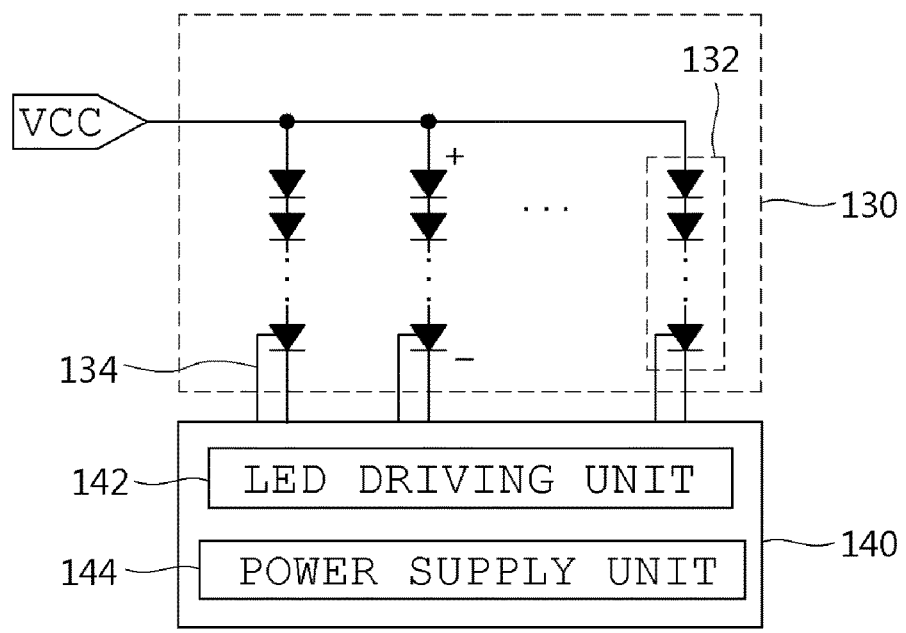
FIGS. 5A and 5B are schematic views illustrating light emitting devices including the LED having the control electrode shown in FIG. 3.
Figure 5B:
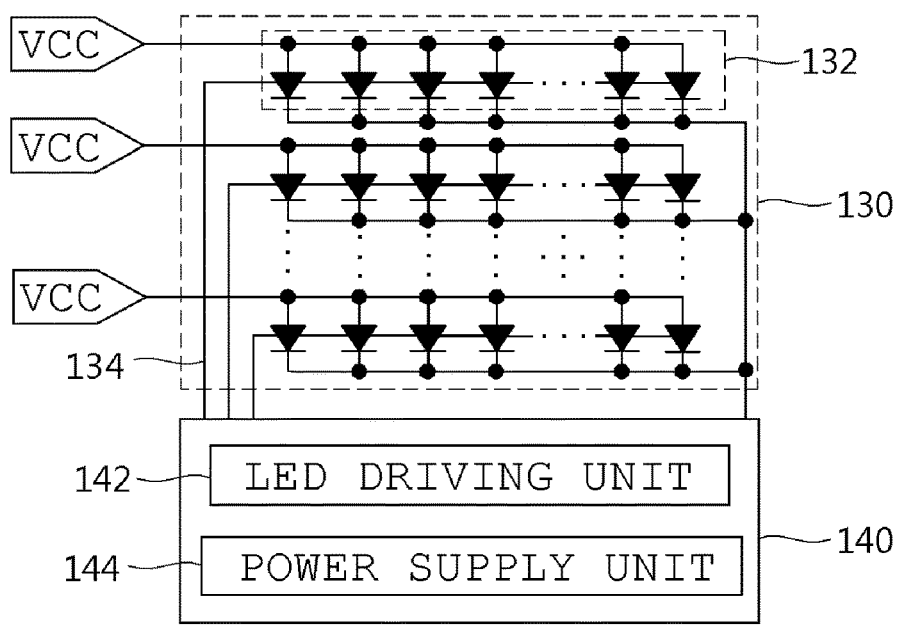

FIGS. 5A and 5B are schematic views illustrating light emitting devices including the LED having the control electrode shown in FIGS. 4A and 4B.

Each of the light emitting devices shown in FIGS. 5A and 5B includes a light emitting panel 130 and a circuit board 140 on which an LED driving unit 142 to drive the light emitting panel 130 is mounted.

The light emitting panel 130 shown in FIG. 5A includes at least one LED channel 132 including a plurality of LEDs connected in series. The control electrode 106 of each of the LEDs included in each LED channel 132 is connected to a control line 134, or the control electrode 106 of the LED closest to the circuit board 140 out of the LEDs included in each LED channel 132 is connected to the control line 134. Further, as exemplarily shown in FIG. 5A, the LED closest to the circuit board 140 out of the LEDs included in each LED channel 132 may employ the 3-electrode LED including the control electrode 106 in accordance with the present disclosure, and the remaining LEDs out of the LEDs included in each LED channel 132 may employ a 2-electrode LED excluding the control electrode 106. When a third voltage V3 higher than the second voltage V2 supplied to a second electrode 104 of the LED is supplied to the control line 134 of each LED channel 132, current flow in the LED is blocked. Therefore, when a third voltage V3 lower than the second voltage V2 (VCC) supplied to the second electrode 104 of the LED is supplied to the control line 134 of each LED channel 132, current flowing in the LED channel 132 is supplied to the LED driving unit 142.

The light emitting panel 130 shown in FIG. 5B includes at least one LED channel 132 including a plurality of LEDs connected in parallel. A second voltage V2 (VCC) is supplied to the second electrode 104 of each of the LEDs included in each LED channel 132. Further, the control electrodes 106 of the respective LEDs included in each LED channel 132 are connected to the same control line 134. Such a light emitting panel 130 may selectively drive the respective LED channels 132. For example, when a third voltage V3 higher than the second voltage V2 supplied to the second electrodes 104 of the LEDs is supplied to the control line 134 of the LED channel 132 disposed as a first row of the light emitting panel 130, the LED channel 132 disposed as the first row does not emit light. Further, when a third voltage V3 lower than the second voltage V2 (VCC) supplied to the second electrodes 104 of the LEDs is supplied to the control lines 134 of the LED channels 132 disposed as the remaining rows of the light emitting panel 130 except for the first row, the LED channels 132 disposed as the remaining rows except for the first row emit light.

A power supply unit 144 and the LED driving unit 142 are disposed on the circuit board 140. Here, the power supply unit 144 and the LED driving unit 142 may be formed as a single chip or formed as respective chips and, thus, be mounted on the circuit board 140.

The LED driving unit 142 uniformly controls current flowing in each of the LED channels 132. The LED driving unit 142 converts information regarding current of the LED channels 132 or voltage applied to the LED channels 132 into feedback information and then supplies the feedback information to the power supply unit 144.

The power supply unit 144 generates a plurality of driving voltages including first to third voltages V1, V2, V3 and VCC supplied to the LEDs 100 according to feedback information transmitted from the LED driving unit 142. Particularly, the third voltage V3 is supplied to the control electrode 106 of the LED 100 through the control line 134.

As described above, in the light emitting device in accordance with the present disclosure, the LED has a transistor function and, thus, a transistor connected to the LED may be omitted from the circuit board 140. Therefore, the light emitting device in accordance with the present disclosure may reduce the area of the circuit board 140 by an area conventionally occupied by a transistor.

The light emitting devices shown in FIGS. 5A and 5B may be applied to an electronic apparatus, such as a lighting unit, a backlight unit of a liquid crystal display device, a display device, a streetlamp, a traffic light, etc.

As is apparent from the above descriptions, a light emitting element and a light emitting device including the same in accordance with the present disclosure include a control electrode which converts a movement path of holes or electrons, supplied to an active layer, into a direction opposite the active layer and may thus control light emission of the active layer without a separate transistor. Therefore, since the conventional transistor connected to a light emitting element can be omitted, power loss generated due to the transistor can be prevented and, thus, power consumption can be reduced. Further, the area of a circuit board can be reduced by an area conventionally occupied by the transistor.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting element, comprising:
an active layer disposed on a substrate and emitting light;
first and second semiconductor layers facing each other with the active layer interposed therebetween;
a first electrode contacting one of the first and second semiconductor layers;
a second electrode contacting the other of the first and second semiconductor layers;
a control electrode configured to control the emitted light from the active layer; and
a third semiconductor layer contacting the control electrode.

2. The light emitting element according to claim 1, wherein the third semiconductor layer disposed between the substrate and the first semiconductor layer.

3. The light emitting element according to claim 2, further comprising an interlayer insulating film disposed between the first and third semiconductor layers.

4. The light emitting element according to claim 2, wherein:
the second and third semiconductor layers include one of n-type and p-type semiconductors; and
the first semiconductor layer includes a type of semiconductor different from the second and third semiconductor layers.

5. The light emitting element according to claim 1, wherein:
when the light emitting element emits light, a first voltage is applied to the first electrode and a second voltage higher than the first voltage is applied to the second electrode; and
when the light emitting element does not emit light, the first voltage is applied to the first electrode, the second voltage higher than the first voltage is applied to the second electrode, and a third voltage higher than the second voltage is applied to the control electrode.

6. A light emitting device, comprising:
a light emitting panel including at least one LED channel including a plurality of light emitting elements; and
an LED driving unit configured to drive the at least one LED channel,
wherein each of the light emitting elements includes:
an active layer disposed on a substrate;
first and second semiconductor layers facing each other with the active layer interposed therebetween;
a first electrode contacting one of the first and second semiconductor layers;
a second electrode contacting the other of the first and second semiconductor layers;
a control electrode configured to control the emitted light from the active layer; and
a third semiconductor layer contacting the control electrode.

7. The light emitting device according to claim 6, wherein the third semiconductor layer disposed between the substrate and the first semiconductor layer.

8. The light emitting device according to claim 7, further comprising an interlayer insulating film disposed between the first and third semiconductor layers.

9. The light emitting device according to claim 7, wherein:
the second and third semiconductor layers include one of n-type and p-type semiconductors; and
the first semiconductor layer includes a type of semiconductor different from the second and third semiconductor layers.

10. The light emitting device according to claim 6, wherein:
when the light emitting element emits light, a first voltage is applied to the first electrode and a second voltage higher than the first voltage is applied to the second electrode; and
when the light emitting element does not emit light, the first voltage is applied to the first electrode, the second voltage higher than the first voltage is applied to the second electrode, and a third voltage higher than the second voltage is applied to the control electrode.

11. The light emitting device according to claim 6, wherein each of the at least one LED channel includes a plurality of light emitting elements connected in series.

12. The light emitting device according to claim 11, further comprising a control line configured to connect the control electrode of at least one of the light emitting elements included in each of the at least one LED channel to the LED driving unit.

13. The light emitting device according to claim 6, wherein each of the at least one LED channel includes a plurality of light emitting elements connected in parallel.

14. The light emitting device according to claim 13, wherein:
the control electrodes of the light emitting elements included in each of the at least one LED channel are connected to the same control line; and
the control line is connected to the LED driving unit.

15. A light emitting element on a substrate, comprising:
an active layer disposed on the substrate and emitting light;
first and second semiconductor layers facing each other with the active layer interposed therebetween;
a first electrode contacting one of the first and second semiconductor layers;
a second electrode contacting the other of the first and second semiconductor layers;
a control electrode configured to turn on and turn off an emission from the active layer by reversing a moving path of electrons and holes supplied to the active layer; and
a third semiconductor layer contacting the control electrode.

16. The light emitting element according to claim 15, wherein the third semiconductor layer disposed between the substrate and the first semiconductor layer.

17. The light emitting element according to claim 16, further comprising an interlayer insulating film disposed between the first and third semiconductor layers.

18. The light emitting element according to claim 16, wherein the first semiconductor layer includes a type of semiconductor different from those of the second and third semiconductor layers.

19. The light emitting element according to claim 15, wherein the first electrode is applied with a first voltage and the second electrode is applied with a second voltage higher than the first voltage when the light emitting element emits light.

20. The light emitting element according to claim 19, wherein the first electrode is applied with the first voltage, the second electrode is applied with the second voltage higher than the first voltage, and the control electrode is applied with a third voltage higher than the second voltage when the light emitting element does not emit light.

* * * * *